United States Patent
Leeuwenburgh et al.

[11] Patent Number: 5,859,607
[45] Date of Patent: Jan. 12, 1999

[54] RECEIVER WITH DIGITAL PROCESSING OF A PHASE-SPLITTED INPUT SIGNAL

[75] Inventors: Arie J. Leeuwenburgh; Rudy J. Van De Plassche, both of Eindhoven, Netherlands

[73] Assignee: U.S. Philips Corporation, New York, N.Y.

[21] Appl. No.: 802,964

[22] Filed: Feb. 21, 1997

[30] Foreign Application Priority Data

Feb. 29, 1996 [EP] European Pat. Off. ............... 96103084

[51] Int. Cl.[6] .................................................. H03M 1/00
[52] U.S. Cl. ............................................. 341/155; 375/324
[58] Field of Search ........................... 341/155; 375/324, 375/346; 455/296; 329/319

[56] References Cited

U.S. PATENT DOCUMENTS

| | | | |
|---|---|---|---|
| 4,583,239 | 4/1986 | Vance | 375/94 |
| 5,052,050 | 9/1991 | Collier et al. | 455/296 |
| 5,156,343 | 10/1992 | Voorman | 329/319 |
| 5,579,347 | 11/1996 | Lindquist | 375/346 |

FOREIGN PATENT DOCUMENTS

0486095a1  11/1991   European Pat. Off. .

*Primary Examiner*—Howard L. Williams
*Attorney, Agent, or Firm*—Michael E. Marion

[57] ABSTRACT

In a receiver, both an A/D conversion (ADC) and a phase-split (PSF) is carried out on an input signal (R) to obtain a pair of digital signals (Xd,Yd) which are mutually phase shifted. The pair of digital signals (Xd,Yd) is processed (VSP) as a vectorial signal with a frequency-characteristic which is asymmetrical with respect to zero frequency. In order to make the receiver better suited for relatively low A/D conversion sampling frequencies (Fs), the phase-split (PSF) is carried out prior to the A/D conversion (ADC).

4 Claims, 3 Drawing Sheets

RECEIVER WITH DIGITAL PROCESSING OF A PHASE-SPLITTED INPUT SIGNAL

BACKGROUND OF THE INVENTION

1. Field of the Invention

The invention relates to a receiver and a method of reception in which both an A/D conversion and a phase-split is carried on an input signal to obtain a pair of digital signals which are mutually phase shifted and further processed as a vectorial signal.

2. Description of the Related Art

European Patent Application EP-A 0 486 095 discloses a prior-art receiver of the above-identified type. In the prior-art receiver, a reception signal is first pre-processed by means of analog filters and analog amplifiers. Subsequently, the pre-processed reception signal is subjected to an analog-to-digital (A/D) conversion. A digital filter converts the digitized reception signal into a pair of phase quadrature signals xi and yi. The pair of phase quadrature signals xi and yi is applied to a first Cordic processor which carries out a frequency conversion. As a result, a pair of baseband phase quadrature signals xo and yo is obtained, this pair being low-pass filtered and, subsequently, applied to a second Cordic processor for FM demodulation. For a more comprehensive understanding of the prior-art receiver, reference is made to EP-A 0 486 095 which, in particular, explains the operation of the Cordic processors in great detail.

In EP-A 0 486 095, it is stated that the sampling frequency of the A/D conversion should be at least twice the highest frequency in the radio-frequency (RF) reception range. In a practical embodiment of the prior art receiver with an RF reception range between 87.5 and 108 MHz, the sampling frequency was 350 Mhz.

SUMMARY OF THE INVENTION

The invention seeks, inter alia, to provide a receiver of the above-identified type which, with respect to the prior-art receiver, is better suited for a relatively low A/D conversion sampling frequency.

To this end, the invention provides a receiver comprising an input section for carrying out both an A/D conversion and a phase-split on an input signal to obtain a pair of digital signals which are mutually phase shifted; and a vectorial signal processor for processing said pair of digital signals as a vectorial signal, the vectorial signal processor having an asymmetrical frequency-characteristic with respect to zero frequency, characterized in that the input section is arranged to carry out the phase-split prior to the A/D conversion.

The invention further provides a method of reception comprising the steps of carrying out both an A/D conversion and a phase-split on an input signal to obtain a pair of digital signals which are mutually phase shifted; and processing said pair of digital signals as a vectorial signal with a frequency characteristic which is asymmetrical with respect to zero frequency, characterized in that the method comprises the step of phase-splitting the input signal prior to the A/D conversion.

The invention takes the following aspects into consideration. An A/D conversion is accompanied with aliasing, whereby signals within frequency ranges other than the desired frequency range may cause interference. The former frequency ranges will be referred to as aliasing frequency ranges. In order to avoid signal distortion, sufficient attenuation within each of the aliasing frequency ranges is required.

In the prior art, the analog filters prior to the A/D conversion need to provide the required attenuation within the aliasing frequency ranges. The lower the A/D conversion sampling frequency is, the nearer the aliasing frequency ranges will be to the RF reception range and, consequently, the more complicated the analog filters need to be in order to provide sufficient attenuation within the aliasing frequency ranges. Below a certain A/D conversion sampling frequency, the analog filters may even prove not to be feasible at all.

In accordance with the invention, the phase-split is carried out prior to the A/D conversion. That is, an input signal is first phase-splitted and, subsequently, digitized. The phase-splitted signal may be regarded as a vectorial signal in which either positive-frequency components or negative-frequency components dominate. That is, the phase-split has a frequency characteristic which is asymmetrical with respect to zero frequency. The phase-splitted and digitized signal is processed as a vectorial signal in a vectorial signal processor whose frequency characteristic is also asymmetrical with respect to zero frequency. It is noted that, in the prior-art receiver, the combination of the first Cordic, the second Cordic and the low-pass filters thereinbetween, constitutes such a vectorial signal processor, although this is not recognized in EP-A 0 468 095.

The asymmetrical frequency characteristic of the phase-split and that of the vectorial signal processor, respectively, before and after the A/D conversion, effectively provide attenuation within certain aliasing frequency ranges. Consequently, in the invention, any analog filters prior to the A/D conversion need to provide relatively little attenuation in these aliasing frequency ranges, or even no attenuation at all, and may therefore be relatively simple. This particularly applies if the A/D conversion sampling frequency is relatively low. In that case, one of the aliasing frequency ranges will be relatively near to the desired frequency range. In the prior art receiver, relatively complicated analog filters are needed in order to obtain the required attenuation within this aliasing frequency range. However, in the invention, at least a part of the required attenuation within this aliasing frequency range is provided by the combination of the asymmetrical frequency characteristic of the phase-split and that of the vectorial signal processor. Consequently, any analog filters prior to the A/D conversion need to provide the remaining portion of the required attenuation only, or even no attenuation at all, and may therefore be relatively simple.

In conclusion, the invention allows a relatively low A/D conversion sampling frequency without, as in the prior art, a relatively severe penalty in terms of filter complexity. If the A/D conversion sampling frequency is relatively low, the power consumption of the A/D conversion circuitry will be relatively modest, as well as that of any digital circuitry coupled thereto. Thus, the invention contributes to a low power consumption, which is particularly important in portable applications. Furthermore, the lower the A/D conversion sampling frequency, the lesser the extent to which it will leak to other circuitry thereby causing interference. Thus, the invention also contributes to an acceptable electromagnetic compatibility.

The invention and additional features, which may optionally be used to implement the invention to advantage, will be apparent from and elucidated with reference to the drawings described hereinafter.

DESCRIPTION OF THE PREFERRED EMBODIMENTS

Figure 1:
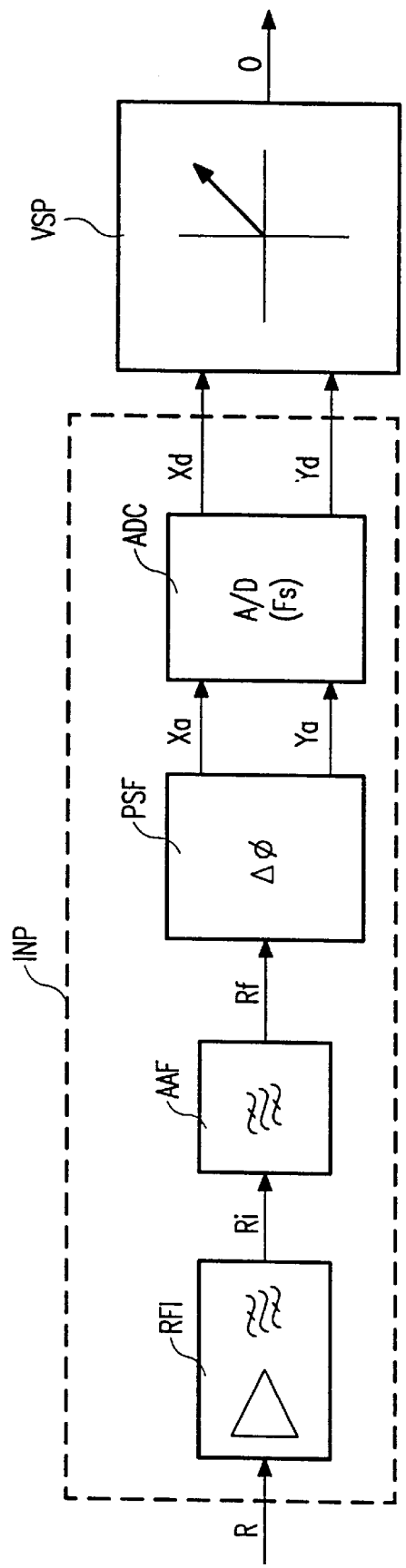
FIG. 1 shows an example of a receiver in accordance with the invention in the form of a block schematic diagram.

FIG. 1 shows an example of a receiver in accordance with the invention. The FIG. 1 receiver derives an output signal O from a reception signal R supplied thereto. The FIG. 1 receiver comprises an input section INP and a vectorial signal processor VSP. In more detail, the input section INP includes an input circuit RFI and an analog filter AAF which are both optional. The input section INP further includes a phase-splitting filter PSF and an A/D converter arrangement ADC.

The input circuit RFI provides an intermediate reception signal Ri in response to the reception signal R. The input circuit RFI may, for example, include a frequency converter or tuner for converting the reception signal R to an intermediate frequency. The input circuit RFI may also be more or less similar to the analog pre-processing in the prior-art receiver which pre-processing does not shift the frequency of the reception signal.

The analog filter AAF provides a filtered reception signal Rf in response to the intermediate signal Ri. The analog filter AAF may, for example, attenuate signals whose frequencies differ from that of the desired reception signal. Then, it will contribute to the suppression of aliasing which is accompanied with the A/D conversion in the A/D converter arrangement ADC. This will be discussed in greater detail hereinafter.

The phase-splitting filter PSF provides, in response to the filtered reception signal Rf, a pair of signal Xa,Ya which are mutually phase-shifted. The phase-splitting filter PSF may include, for example, two separate analog filters, each of which shifts the phase of the filtered reception signal Rf to a different extent. However, the phase-splitting filter PSF may also be a so-called analog polyphase filter having two inputs, one of which receives the filtered reception signal Rf, whereas the other input does not receive any signal.

The A/D converter arrangement ADC digitizes the pair of signals Xa,Ya with a sampling frequency Fs. Accordingly, it provides a pair of digital signals Xd,Yd which are mutually phase-shifted. The A/D converter arrangement ADC may, for example, comprise two separate A/D converters: one for each signal in the pair of digital signal Xa,Ya. However, the A/D converter arrangement ADC may also comprise a single A/D converter operating in a time-multiplex manner. For example, the single A/D converter may alternately convert one and the other signal in the pair of signals Xa,Ya.

The vectorial signal processor VSP processes the pair of digital signals Xd,Yd as a vectorial signal to provide, in response, the output signal O. The vectorial signal processor VSP has a frequency characteristic which is asymmetrical with respect to zero frequency. For example, the vectorial signal processor VSP may process either negative or positive frequency components in the pair of digital signals Xd,Yd.

The vectorial signal processor VSP may comprise, for example, a first Cordic processor for carrying out a frequency shift, a filter arrangement for providing a certain pass band, and a second Cordic processor for carrying out an amplitude, phase- or frequency-demodulation. Such a combination of elements is described in EP-A 0 486 095. However, EP-A 0 468 095 does not recognize that this combination of elements constitutes a vectorial signal processor having a frequency characteristic which is asymmetrical with respect to zero frequency.

Figure 2A:
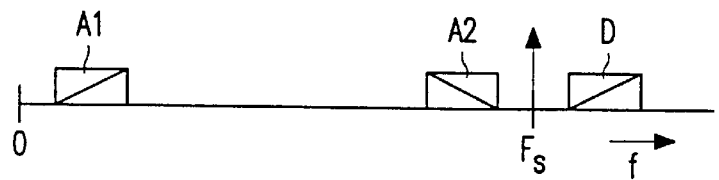
FIGS. 2a to 2f illustrate the operation of the FIG. 1 receiver by means of frequency diagrams which relate to various different points and blocks in the FIG. 1 receiver.

The operation of the FIG. 1 receiver is further explained, by way of example, with reference to FIGS. 2a to 2f. FIG. 2a shows a spectrum which relates to the intermediate reception signal Ri. In the FIG. 2a spectrum, there is a desired frequency range D in which a desired signal may be located. Furthermore, FIG. 2a shows two aliasing frequency ranges A1 and A2. A signal in any of these aliasing frequency ranges A1 and A2 may interfere with the desired signal due to aliasing in the A/D converter arrangement ADC. Those skilled in the art may readily conceive other aliasing frequency ranges which are not shown in FIG. 2a.

Figure 2B:
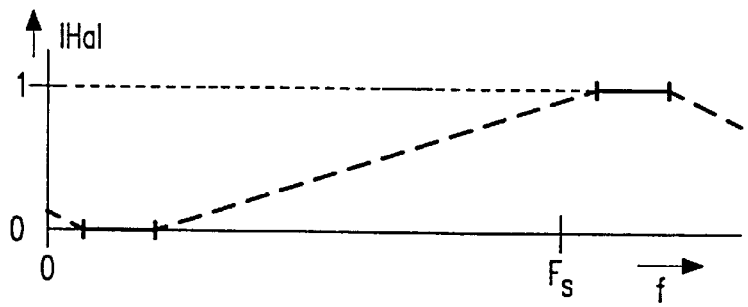

FIG. 2b illustrates the magnitude-frequency characteristic of the analog filter AAF. The horizontal frequency (f) axis of FIG. 2b corresponds with that of FIG. 2a. The magnitude |Ha| of the analog filter AAF is approximately one (1) throughout the desired frequency range D, and it is substantially zero (0) throughout the aliasing frequency range A1. The magnitude-frequency characteristic has a relatively gentle slope between the aforementioned frequency ranges which are relatively distant. In FIG. 2b, the slope is illustrated by broken lines.

Figure 2C:
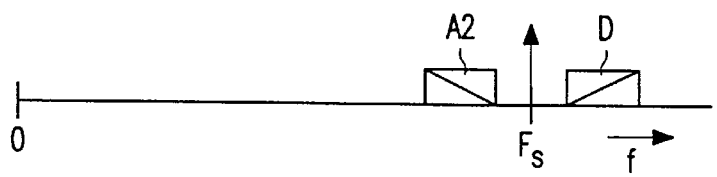

FIG. 2c shows a spectrum which relates to the filtered reception signal Rf in the FIG. 1 receiver. The FIG. 2c spectrum is directly derivable from the FIG. 2a spectrum and the FIG. 2b magnitude-frequency characteristic. The aliasing frequency range A1 is not indicated in the FIG. 2c spectrum, because any signal in this frequency range will be substantially attenuated by the analog filter AAF. However, any signal within the aliasing frequency range A2 will not be substantially attenuated, the reason for which the aliasing frequency range A2 is shown in FIG. 2c.

Figure 2D:
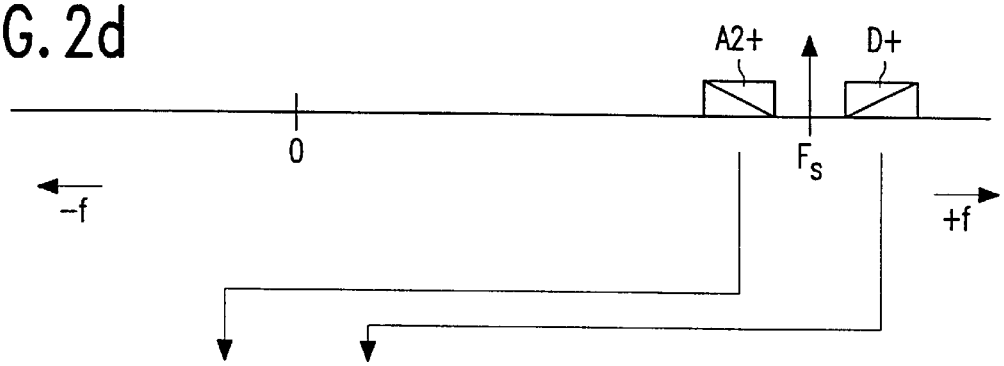

FIG. 2d shows a spectrum which relates to the pair of signals Xa,Ya which are mutually phase-shifted. The FIG. 2d the spectrum has a positive frequency portion +f and negative frequency portion −f. The reason for this is that the pair of signals Xa,Ya may be regarded as a vectorial signal which allows a distinction between positive and negative frequencies. Consequently, the FIG. 2d spectrum does not need to be symmetric with respect to zero (0) frequency, in contrast to the FIGS. 2a and 2c spectra which relate to scalar signals.

The FIG. 2d spectrum shows the following effect of the phase-splitting filter PSF. For any signal within the aliasing frequency range A2, shown in FIG. 2c, the phase-splitting filter PSF will substantially provide a corresponding positive-frequency vectorial signal. Therefore, the FIG. 2d spectrum has an aliasing frequency range A2+ in its positive frequency portion +f, but not a complementary aliasing frequency range A2− in its negative frequency portion −f. The aforementioned also applies with regard to the desired frequency range D in the FIG. 2c spectrum, the reason for which the FIG. 2d spectrum has a desired frequency range D+ in its positive frequency portion +f only. However, the latter is not essential to the invention, which will be apparent from an explanation hereinafter with reference to FIGS. 3a and 3b.

Figure 2E:
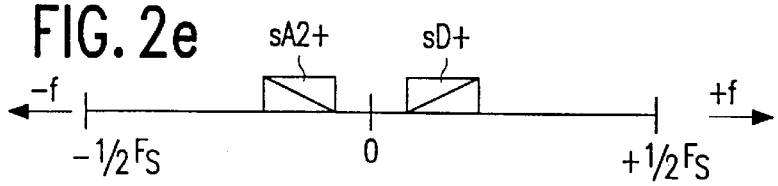

FIG. 2e shows a spectrum which is related to the pair of digital signals Xd,Yd in the FIG. 1 receiver. Because the signals are time-discrete, it is sufficient to show the spectrum between −½Fs and +½Fs only, Fs being the sampling frequency of the A/D converter arrangement ADC. FIG. 2e shows the following effect of the A/D conversion in the A/D converter arrangement ADC. Any signals in the desired frequency range D+ are shifted in frequency by an amount −Fs. As a result, they will fall within a shifted desired frequency range sD+ shown in FIG. 2e. The same applies to any signals within the aliasing frequency range A2+, shown in FIG. 2d, which will fall within a shifted aliasing frequency range sA2+, shown in FIG. 2e. The shifted desired frequency range sD+ is in the positive frequency portion +f of the FIG. 2e spectrum, whereas the shifted aliasing frequency range sA2+ is in the negative frequency portion.

Figure 2F:
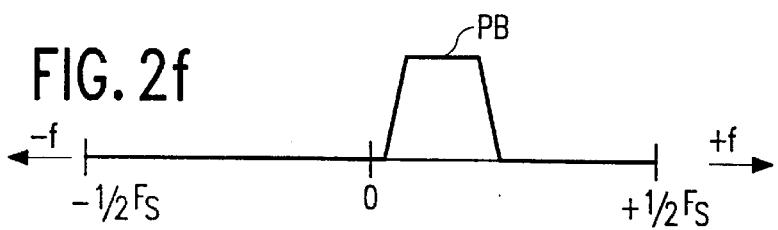

FIG. 2f illustrates the frequency characteristic of the vectorial signal processor VSP in the FIG. 1 receiver. The frequency characteristic is asymmetrical with respect to zero frequency. There is a pass-band PB in the positive frequency portion of the FIG. 2f frequency characteristic for which there is no counterpart in the negative frequency portion. Therefore, it can be said that the vectorial signal processor VSP selectively processes positive frequency components, but not negative frequency components. For that reason, any signals in the shifted aliasing frequency range sA2+ will not interfere with any signal in the shifted desired frequency range sD+. Moreover, referring back to FIG. 2a, any signals in the aliasing frequency range A2 will not interfere with any signal in the desired frequency range D. This is due to the fact that, in accordance with the invention, the phase-split has been carried out prior to the A/D conversion.

Figure 3A:
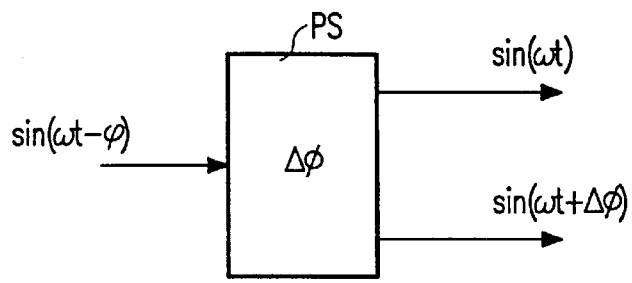
FIG. 3a to 3c are conceptual diagrams illustrating a conversion of a scalar signal into a vectorial signal by means of a phase-split and the asymmetrical frequency characteristic associated therewith.
Figure 3B:
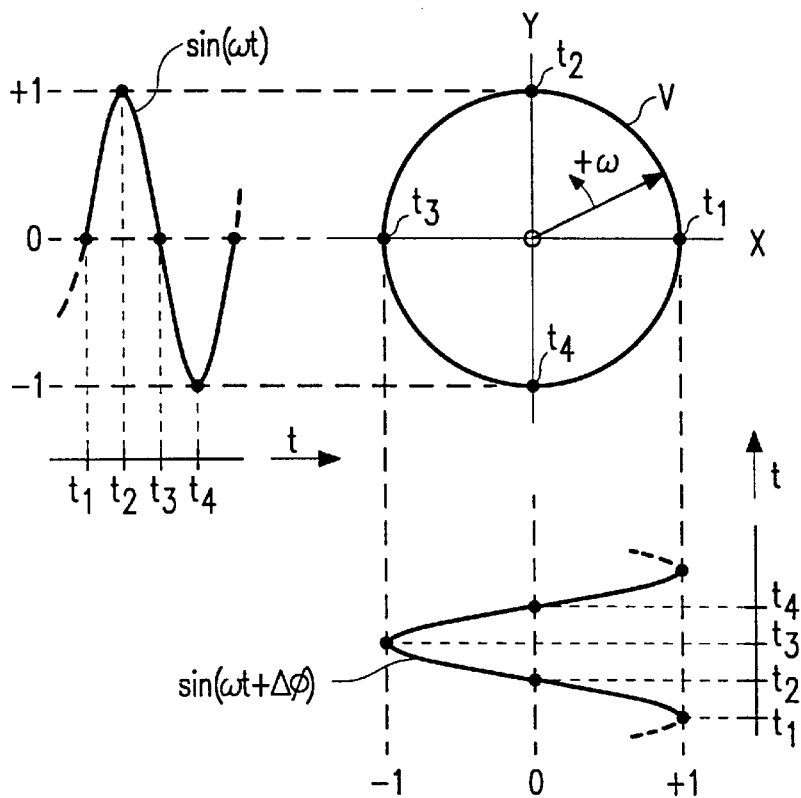
Figure 3C:
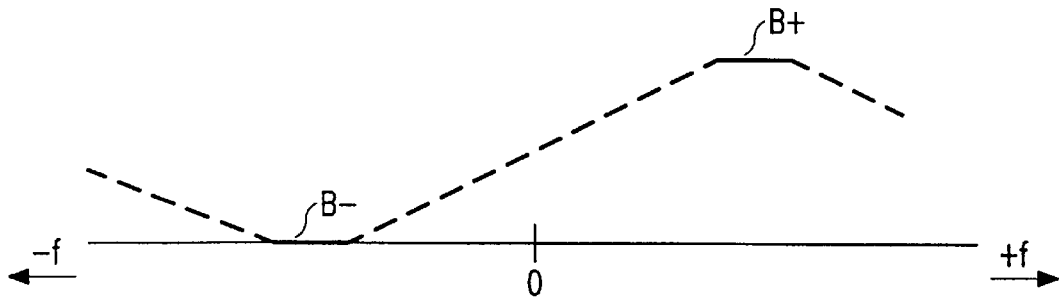

FIGS. 3a, 3b and 3c illustrate that a phase-split produces either positive-frequency vectorial signals or negative-frequency vectorial signals and, therefore, effectively has a frequency characteristic which is asymmetrical with respect to zero (0) frequency. FIG. 3a shows a phase-splitter PS which receives an input signal sin(ωt−φ), ω being the radian frequency of the signal and φ being an arbitrary phase condition of the signal. In response, the phase-splitter provides an output signal sin(ωt) and an output signal sin(ωt+Δφ), Δφ being the mutual phase shift between the output signals.

FIG. 3b illustrates a vectorial signal in which the output signals sin(ωt) constitutes an Y-component and the output signal sin(ωt+Δφ) constitutes an X-component. Consequently, in FIG. 3b, the output signals sin(ωt) and sin(ωt+Δφ) are projected on axises X and Y, respectively. The respective values of the output signals determine the position of a signal vector V. In FIG. 3, four consecutive points in time are indicated: t1, t2, t3 and t4, at which the value of ωt is 0, ½π, π, and 1½π radians, respectively. Furthermore, it is assumed that the mutual phase shift Δφ is +½π radians.

The signal vector V, shown in FIG. 3b, rotates counter-clockwise in a perfectly circular manner with a constant angular speed ω. The spectrum of such a vectorial signal comprises a positive-frequency component +ω only. Thus, there is no negative-frequency counterpart −ω. In other words, the vectorial signal illustrated in FIG. 3b is a perfectly positive-frequency vectorial signal. However, if the mutual phase shift Δφ is −½π radians instead of +½π radians, a perfectly negative-frequency vectorial signal will be obtained. If the mutual phase difference Δφ is not either exactly −½π or +½π radians, the signal vector will not rotate in a perfectly circular manner, but rather in an elliptical manner. This means that the spectrum will comprise both negative-frequency components and positive-frequency components. However, either one of these components will dominate. Which one depends on the sign of the mutual phase difference Δφ.

FIG. 3c illustrates, by way of example, a frequency characteristic of a phase-split which is such that FIG. 3b applies for input signals throughout a frequency range B. That is, Δφ is substantially +½π radians for input signals throughout the frequency range B. Accordingly, the FIG. 3b frequency characteristic has a pass band B+ in its positive-frequency portion, whereas it has a stop band B− in its negative-frequency portion. If the FIG. 3c frequency characteristic were that of phase-splitting filter PSF in the FIG. 1 receiver, the frequency range B should preferably cover the aliasing frequency range A2.

The drawings and their description hereinbefore, illustrate rather than limit the invention. Evidently, there are numerous alternatives which fall within the scope of the appended claims. In that respect, the following closing remarks are made.

There are numerous ways of physically spreading functions or functional elements over various units. In this respect, the drawings are very diagrammatic and respectively represent only one possible embodiment of the invention. As an example, although FIG. 1 shows two separate connections which transfer the pair of digital signals Xd,Yd, a single connection may also be used for transferring this pair in a time-multiplex manner. As an other example, the FIG. 2b magnitude-frequency characteristic may be provided by the phase-splitting filter PSF in the FIG. 1 receiver, in which case the analog filter AAF may be dispensed with.

Although FIG. 2f shows, by way of example, that the vectorial signal processor VSP in the FIG. 1 receiver favors positive-frequency components over negative-frequency components, the inverse is by no means excluded. If the vectorial signal processor VSP favored negative-frequency components over positive-frequency components, the sampling frequency Fs would preferably be somewhat higher than the desired frequency range D shown in FIG. 2a. In that case, the aliasing frequency range A2 would be located somewhat above the sampling frequency. As a result, the shifted desired frequency range sD+ would fall in the negative-frequency portion of the FIG. 2e spectrum, whereas the shifted aliasing frequency range sA2+ would fall in the positive-frequency portion. A similar reasoning applies with regard to the phase-splitting filter PSF in the FIG. 1 receiver: it does not matter whether it provides a substantially positive-frequency or negative-frequency vectorial signal. All what matters is that it precedes the A/D converter arrangement ADC and that the vectorial signal processor VSP has a frequency characteristic which is asymmetrical with respect to zero frequency.

Although FIG. 2f shows, by way of example, that the vectorial signal processor VSP in the FIG. 1 receiver is substantially insensitive to any signal in the shifted aliasing frequency range sA2+, which is preferable, it is not essential to the invention. All what matters is that the vectorial signal processor VSP has an asymmetrical frequency characteristic and, therefore, is less sensitive to any signal in the shifted aliasing band sA2+ than to any signal in the shifted desired frequency range sD+. This difference in sensitivity effectively provides a certain amount of attenuation within the aliasing band A2 shown in FIG. 2a. Any further attenuation, if so required to achieve a satisfactory performance, may be provided by the analog filter AAF. A similar reasoning applies with regard to the phase-splitting filter PSF: it does not necessarily have to provide a perfectly positive-frequency or a perfectly negative-frequency vectorial signal. In that respect, the phase-splitting filter PSF may provide a mutual phase-shift which differs from $-\frac{1}{2}\pi$ or $+\frac{1}{2}\pi$ radians, to compensate non-perfect orthogonality in the vectorial signal processor VSP for example.

The structure of the vectorial signal processor VSP is not essential to the invention. As an example, a quadrature multiplier-oscillator arrangement may be used instead of a Cordic processor to carry out, for example, a frequency shift or a demodulation. It should be noted that, if the vectorial signal processor VSP carries out a frequency shift, it should preferably shift the vectorial signal it receives to an intermediate frequency which is not zero. In that case, any phase-inaccuracy in the mutual phase shift, for example due to tolerances, will not substantially affect the properties of the desired signal.

We claim:

1. A receiver comprising:

an input section for A/D converting and phase-splitting an input signal to obtain a pair of digital signals (Xd,Yd) which are mutually phase shifted; and a vectorial signal processor for processing said pair of digital signals as a vectorial signal, the vectorial signal processor having an asymmetrical frequency-characteristic with respect to zero frequency; characterized in that the input section is arranged to carry out the phase-splitting prior to the A/D conversion.

2. A receiver as claimed in claim 1, characterized in the input section comprises an analog filter for filtering the input signal prior to phase-splitting.

3. A receiver as claimed in claim 1, characterized in that the input section comprises a frequency converter for converting the input signal to an intermediate frequency prior to phase-splitting.

4. A method of reception comprising the steps:

A/D converting and phase-splitting an input signal to obtain a pair of digital signals (Xd,Yd) which are mutually phase shifted; and processing said pair of digital signals (Xd,Yd) as a vectorial signal with a frequency characteristic which is asymmetrical with respect to zero frequency; characterized in that the step of phase-splitting the input signal is performed prior to the step of A/D converting.

* * * * *